(12) United States Patent  
Fu

(10) Patent No.: US 7,719,328 B2
(45) Date of Patent: *May 18, 2010

(54) SELF-BIASED PHASE LOCKED LOOP

(75) Inventor: Zhigang Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/336,428

(22) Filed: Dec. 16, 2008

(65) Prior Publication Data

US 2009/0289725 A1 Nov. 26, 2009

(30) Foreign Application Priority Data

May 23, 2008 (CN) .................. 2008 1 0038056

(51) Int. Cl.
H03L 7/06 (2006.01)
(52) U.S. Cl. ...................................... 327/156; 327/147
(58) Field of Classification Search ................ 327/147, 327/156; 331/1 A, 16, 17
See application file for complete search history.

(56) References Cited

U.S. PATENT DOCUMENTS 7,078,977 B2 * 7/2006 Maneatis ..................... 331/16
7,310,020 B2 * 12/2007 Tan et al. ..................... 331/16
7,443,761 B2 * 10/2008 Lin .......................... 365/233.1
7,466,174 B2 * 12/2008 Tirumalai et al. ........... 327/156
2008/0150596 A1 * 6/2008 Fayneh et al. .............. 327/157

* cited by examiner

Primary Examiner—Lincoln Donovan
Assistant Examiner—Adam D Houston
(74) Attorney, Agent, or Firm—Squire, Sanders & Dempsey, L.L.P.

(57) ABSTRACT

The present invention discloses a self-bias PLL including a phase frequency detector, a charge pump, a loop filter, a voltage control oscillator, a divider and a bias current converter. A charging or discharging current output from the charge pump equals to a first control current. A resistor of the loop filter is controlled by a first control voltage a second control voltage which is adjusted according to the first control voltage and a second control current. The loop filter increases or decreases the first control voltage according to the charging or discharging current output from the charge pump. The voltage control oscillator generates a bias current and an oscillation voltage according to the first control voltage and increases or decreases an oscillation frequency according to the increase or decrease of the oscillation voltage. The circuit structure of the self-bias PLL is simple and the self-bias PLL has a low jitter.

6 Claims, 4 Drawing Sheets

SELF-BIASED PHASE LOCKED LOOP

CROSS-REFERENCE TO RELATED APPLICATION

This application is related to a co-pending U.S. application Ser. No. 12/189,085, assigned to the same assignee as this application.

This application claims the priority of Chinese Patent Application No. 200810038056.0, filed May 23, 2008, the entire disclosure of which is incorporated herein by reference.

FIELD OF THE INVENTION

The present invention relates to the field of phase locked loop, and in particular to a self-biased phase locked loop.

BACKGROUND OF THE INVENTION

A Phase Locked Loop (PLL) is widely applied in a System on Chip (SOC) to constitute a frequency synthesizer, a clock generator and the like. FIG. 1 is a basic structure of a PLL, in which a Phase Frequency Detector (PFD) 10 detects a frequency difference and a phase difference between an input signal $F_{ref}$ and a feedback signal $F_{fb}$, and generates pulse control signals UP and DN and sends them to a Charge Pump (CP) 20. In the CP 20, the pulse control signals UP and DN are converted into a current $I_P$ so as to charge or discharge a capacitor $C_P$ in a Loop Filter (LP) 30, the LP 30 generates and sends a control voltage $V_{ctrl}$ to a Voltage Control Oscillator (VCO) 40. The VCO 40 increases an oscillation frequency as the control voltage $V_{ctrl}$ is boosted, and the VCO 40 decreases the oscillation frequency as the control voltage $V_{ctrl}$ is dropped. An output signal $F_{out}$ of the VCO 40 results in the feedback signal $F_{fb}$ via a divider 50, so that the entire system forms a feedback system, and the frequency and phase of the output signal $F_{out}$ are locked to a fixed frequency and phase.

A loop damping factor $\xi$ of the PLL illustrated in FIG. 1 is denoted by Equation (1) and a loop bandwidth $\omega_n$ is denoted by Equation (2):

$$\xi = \frac{R_p}{2}\sqrt{\frac{I_p K_v C_p}{N}} \quad (1)$$

$$\omega_n = \sqrt{\frac{K_v I_p}{N C_p}} \quad (2)$$

where $C_P$ denotes the capacitor of the LF 30, $R_P$ denotes a resistor of the LF 30, $I_P$ denotes a current for charging or discharging the capacitor $C_P$ (that is, the charging or discharging current output from the CP 20), $K_v$ denotes a gain of the VCO 40, and N denotes a frequency division factor of the divider 50.

A high performance PLL should have advantages as follows: insusceptibility to variations of process, voltage and temperature (PVT), a wide frequency band, a low phase jitter and a small frequency change after being locked, a monolithic integrated filter, low power consumption for circuit and the like. However, it may be difficult to design a PLL satisfying all the requirements. A conventional PLL based on a VCO has a phase jitter caused by the noise of a power source and a substrate. The loop acts as a low-pass filter for the noise, and the narrower the loop bandwidth is, the lower the jitter will be. On the other hand, the capacitor of the filter can not be manufactured largely in size due to the requirement of monolithic integration, and at the same time, the bandwidth may be restricted by the loop stability condition. These restrictive conditions may result in the designed PLL with a narrow operation band and poor jitter performance.

A method for improving a bandwidth and lowering a jitter is to vary the bandwidth of the PLL to follow the operation frequency of the PLL. The loop has a narrow bandwidth and a low jitter in each operation status, but the varying bandwidth of the PLL may result in a very wide frequency range while reducing phase and frequency jitters introduced by the noise. An example of the method is a self-biased method to design a PLL with a loop damping factor $\xi$ of a fixed value (typically 1). The damping factor $\xi$ and the ratio of the loop width $\omega_n$ to an angular frequency of an input signal $\omega_{ref}$ (hereinafter, referred to as an input frequency, $\omega_{ref}=2\pi F_{ref}$, where $F_{ref}$ denotes a frequency of the input signal) are determined only by a relative value of a capacitor during a fabrication process.

The technical document titled "Low-Jitter Process-Independent DLL and PLL Based on Self-Biased Techniques" (John G Maneatis, IEEE Journal OF Solid-State Circuits, VOL. 31, NO. 11, NOVEMBER 1996) discloses a basic structure of a self-biased PLL. As illustrated in FIG. 2, a capacitor $C_1$ and a bias generator 60 constitute a LF 31, that is, the bias generator 60 creates a resistor of the LF 31, and a current output from an additional CP 21 is applied at the output terminal of a bias voltage $V_{BP}$ of the bias generator 60, so that a CP 20 charges and discharges the capacitor $C_1$ and the CP 21 charges and discharges the resistor created by the bias generator 60.

The bias generator 60 generates bias voltages $V_{BP}$ and $V_{PN}$ from a control voltage $V_{CTRL}$ to provide input voltages to a VCO 41. As illustrated in FIG. 3, the bias generator 60 includes a bias initialization circuit 601, an amplifier bias circuit 602, a differential amplifier circuit 603, a half-buffer replication circuit 604 and a control voltage buffer circuit 605. The amplifier bias circuit 602 provides the differential amplifier circuit 603 with a bias, and the differential amplifier circuit 603 adjusts the bias voltage $V_{BN}$, so that the half-buffer replication circuit 604 and the control voltage buffer circuit 605 replicate the control voltage $V_{CTRL}$ to the bias voltage $V_{BP}$ at the output terminal, that is, $V_{BP}=V_{CTRL}$.

The VCO 41 includes n (n≥3) differential buffer delay stages with symmetric loads, for example, the VCO 41 including three differential buffer delay stages 410 with symmetric loads as illustrated in FIG. 4. The bias voltage $V_{BN}$ provides the symmetric loads 411 and 412 with a bias current $2I_D$ ($I_D$ denotes a current flowing through the symmetric load 411 or 412). The bias voltage $V_{BP}$ of the symmetric loads 411 and 412 equals to the control voltage $V_{CTRL}$, and an equivalent resistance of the symmetric loads 411 and 412 equals to $\frac{1}{2} g_m$, where $g_m$ denotes a transconductance of one transistor in the symmetric loads. A resistance of the symmetric loads 411 and 412, a time delay of the buffer stages and a frequency of the output signal (CK+ or CK−) of the VCO 41 change with the variation of the control voltage $V_{CTRL}$.

It is assumed that the current $I_P$ output from the CPs 20 and 21 is x times than the bias current $2I_D$ of the VCO 41, that is, $I_P=x \cdot 2I_D$, and the resistance $R_P$ of the LF 31 created by the symmetric load 606 in the bias generator 60 is y times than an equivalent resistance $R_o$ of the buffer stages 410 of the VCO 41, that is, $R_p=yR_o=y/2 g_m$. Therefore, a loop damping factor $\xi$ of the self-biased PLL illustrated in FIG. 2 is denoted by Equation (3) and the ratio of an loop bandwidth $\omega_n$ to an input frequency $\omega_{ref}$ is denoted by Equation (4):

$$\xi = \frac{y}{4}\sqrt{\frac{x}{N}}\sqrt{\frac{C_1}{C_B}} \quad (3)$$

$$\frac{\omega_n}{\omega_{ref}} = \frac{xN}{2\pi}\sqrt{\frac{C_B}{C_1}} \quad (4)$$

where $C_B$ denotes a parasitic capacitor of the VCO 41. Thus, parameters x and y and the frequency division factor N may satisfy a certain ratio relationship through a circuit design so as to counteract the frequency division factor N, so that the damping factor $\xi$ of the PLL and the ratio $\omega_n/\omega_{ref}$ of the loop bandwidth to the input frequency only depends on a relative value of the capacitors $C_B$ and $C_1$ in a fabrication process.

Based on the above structure of the self-biased PLL, John G. Maneatis et. al. propose a self-biased PLL (see, "Self-Biased High-Bandwidth Low-Jitter 1-to-4096 Multiplier Clock Generator PLL", IEEE JOURNAL OF SOLID-STATE CIRCUITS, VOL. 38, NO. 11, NOVEMBER 2003) in which the parameters x and y in the formulas 3) and 4) are obtained. Moreover, this document also discloses that two NMOS transistors are added between the differential buffer delay stages with symmetric load in the VCO so as to clamp the phase difference between two output signals to be 180° and ensure that the VCO is able to oscillate (see, page 1801 and FIG. 11).

Compared with a basic PLL, the existing self-biased PLL has the following differences.

1. Two charge pumps are used to discharge and charge the capacitor and the resistor, while in the basic PLL only one charge pump is used.

2. The VCO includes differential buffer delay stages with symmetric loads, while in VCO of the basic PLL, the ring oscillator such as the differential ring oscillator is used. Thus, the NMOS transistor between the differential buffer delay stages with symmetric load may affect the frequency of the output signal from the VCO.

3. A bias generator is added to generate the bias voltage from the control voltage so as to provide the input voltage of the VCO. The circuit structure of the bias generator is complex.

Therefore, in order to meet the requirement that the damping factor of the loop needs to be kept as a fixed value, a large modification is made to the basic PLL to construct the existing self-biased PLL and the structure of the existing self-biased PLL is complex.

SUMMARY OF THE INVENTION

An object of the present invention is to provide a self-biased PLL with simple structure which has a small modification with respect to the basic PLL.

In order to achieve the object, the present invention provides a self-biased PLL including:

a PFD adapted to detect a frequency difference and a phrase difference between an input signal and a feedback signal and generate a pulse control signal;

a CP adapted to generate a charging or discharging current which equals to a first control current input to the CP according to the pulse control signal output from the PFD;

an LF adapted to output the first control voltage so as to raise the first control voltage when the CP outputs a charging current and lower the first control voltage when the CP outputs a discharging current, the resistance of the LF is controlled by the first control voltage and a second control voltage which is adjusted according to the first control voltage and a second control current input to the LF;

a VCO adapted to generate an oscillation voltage and a bias current according to the first control voltage output from the LF, that is, increase an oscillation frequency of an output signal when the oscillation voltage is increased and decrease the oscillation frequency of the output signal when the oscillation voltage is lowered;

a divider adapted to perform a frequency division on the output signal of the VCO and generate the feedback signal input to the PFD; and a bias current converter adapted to convert the bias current generated by the VCO into the first control current input to the CP and the second control current input to the LF, where the first control current equals to the ratio of the bias current to a constant, and the second control current equals to the ratio of the bias current to a frequency division factor of the divider.

Optionally, the LF further includes a filter unit adapted to increase the first control voltage when the CP outputs the charging current and lowers the first control voltage when the CP outputs the discharging current; and a filter bias unit adapted to the adjust the second control voltage according to the first control voltage and the second control current input to the LF.

In one embodiment, the filter bias unit includes a first voltage follower, a first NMOS transistor and a first current source, where, the first control voltage is input to one input terminal of the first voltage follower and the other input terminal of the first voltage follower is connected with an output terminal of the first voltage follower and a source of the first NMOS transistor. A gate and a drain of first NMOS transistor are provided with the second control voltage. The drain-source current of the first NMOS transistor are provided by the first current source. The current provided by the first current source is the second control current output from the bias current converter.

The filter unit further includes a resistor, a capacitor and a second current source. The resistor of the filter unit constructs the resistance of the LF and includes the second NMOS transistor, and the capacitor includes a first capacitor and a second capacitor. One terminal of the first capacitor is connected with a source of the second NMOS transistor. One terminal of the second capacitor is connected with a drain of the second NMOS and the other terminal is connected with the other terminal of the first capacitor and is provided with the first voltage. The drain voltage of the second NMOS transistor is the first control voltage and the gate voltage is the second control voltage. The second current source is connected with the second capacitor and the current of the second current source is the charging or discharging current output from the CP.

Optionally, the VCO includes an oscillation unit adapted to increase the oscillation frequency of the output signal when the oscillation voltage is increased and decrease the oscillation frequency of the output signal when the oscillation voltage is lowered; and an oscillation voltage and bias current generating unit, adapted to generate the bias current and the oscillation voltage provided to the oscillation unit according to the first control voltage.

In one embodiment, the oscillation unit includes at least two differential buffer delay stages connected in series. The positive input terminal of the back differential buffer delay stage is connected with the negative output terminal of the front differential buffer delay stage and the negative input terminal of the back differential buffer delay stage is connected with the positive output terminal of the front differential buffer delay stage. The positive input terminal of the first differential buffer delay stage is connected with the positive output terminal of the last differential buffer delay stage and the negative input terminal of the first differential buffer delay stage is connected with the negative output terminal of the last differential buffer delay stage. The oscillation frequency of the differential buffer delay stage is controlled by the oscillation voltage input.

The differential buffer delay stage includes a third NMOS transistor, a fourth NMOS transistor, a first PMOS transistor, a fifth NMOS transistor, a sixth NMOS transistor and a second PMOS transistor. The gate of the third NMOS transistor and the gate of the first PMOS transistor are positive input terminals and the drain of the third NMOS transistor, the drain of the fourth NMOS transistor, the drain of the first PMOS transistor and the gate of the sixth NMOS transistor are negative output terminals. The gate of the fifth NMOS transistor and the gate of the second PMOS transistor are negative input terminals. The drain of the fifth NMOS transistor, the drain of the sixth NMOS transistor, the drain of the second PMOS transistor and the gate of the fourth NMOS transistor are positive output terminals. The oscillation voltage is provided to the sources of the first PMOS transistor and the second PMOS transistor and the first voltage is provided to the sources of the third NMOS transistor, the fourth NMOS transistor, the fifth NMOS transistor and the sixth NMOS transistor.

The oscillation voltage and bias current unit includes a seventh NMOS transistor, an eighth NMOS transistor, a ninth NMOS transistor, a second voltage follower, a third PMOS transistor and a fourth PMOS transistor. The gate voltage of the seventh NMOS transistor is the first control voltage and the source voltage is the oscillation voltage. The drain of the eighth NMOS transistor is provided with the second voltage and the gate is connected with the RC filter circuit. The drain of the seventh NMOS transistor is connected with the source of the eighth NMOS transistor. The gate of the ninth NMOS transistor is connected with the gate of the seventh NMOS transistor and the source of the ninth NMOS transistor is connected with the output terminal of the second voltage follower. One input terminal of the second voltage follower is provided with the oscillation voltage and the other input terminal is connected with the output terminal of the second voltage follower. The drain of the third PMOS transistor is connected with the drain of the ninth NMOS transistor. The third PMOS transistor and the fourth PMOS transistor construct a current mirror. The current output from the drain of the fourth PMOS transistor is the bias current.

Optionally, the bias current converter includes a first current mirror adapted to be provided with the bias current and output the first control current which is 1/x times than the input current, where x is a constant; and a second current mirror adapted to be provided with the bias current and output the second control current which is 1/N times than the input current, where N is a frequency division factor of the divider.

Compared with the conventional technical means, in the technical solution according to one embedment of the present invention, only one CP is needed to meet the requirement for the self-biased PLL that the damping factor of the loop needs to be kept as a fixed value. Compared with the existing self-biased PLL which includes two CPs, the circuit structure of the self-biased PLL is simplified. Because the oscillation unit of the VCO may directly employ the existing differential ring oscillator, the modification to the basic PLL is very small. Compared with the existing self-biased PLL in which NMOS transistor is added between the differential buffer delay stages with symmetric load, because no NMOS transistor is added between the differential buffer delay stages to ensure that the oscillation unit is able to oscillate, the frequency of the output signal of the VCO will not be affected and the circuit structure is simplified.

In addition, the technical solution according to the present invention also provides the following advantages.

Because the complex bias generator circuit is omitted, the circuit structure of the self-biased PLL is further simplified. Moreover, because the circuit structures of the LF, VCO and the bias current generator are simple, they are easy to be implemented.

The circuit of VCO may restrain the power supply noise. The power supply noise may affect the oscillation voltage. If the noise of the oscillation voltage is small, the frequency of the output signal of the VCO is stable and has a low jitter. Thus, the phase noise of the PLL is also small.

The loop bandwidth of the PLL is optimized. The loop bandwidth will not be too narrow when the input frequency is low and the loop bandwidth will not be too wide when the input frequency is high. Thus, the low frequency noise at the input terminal and the high frequency noise from the VCO can be restrained as far as possible.

DETAILED DESCRIPTION OF THE INVENTION

In embodiments of the present invention, a relationship between a resistor of a LF (that is, $R_P$ in Equation (1)) and a frequency division factor of a divider and a bias current output from a VCO and a relationship between a charging or discharging current output from a CP (that is $I_P$ in Equation (1)) and the bias current output from the VCO are established to eliminate the frequency division factor and the bias current so as to satisfy the requirement that the loop damping factor of the self-biased PLL needs to be kept as a fixed value.

Figure 1:
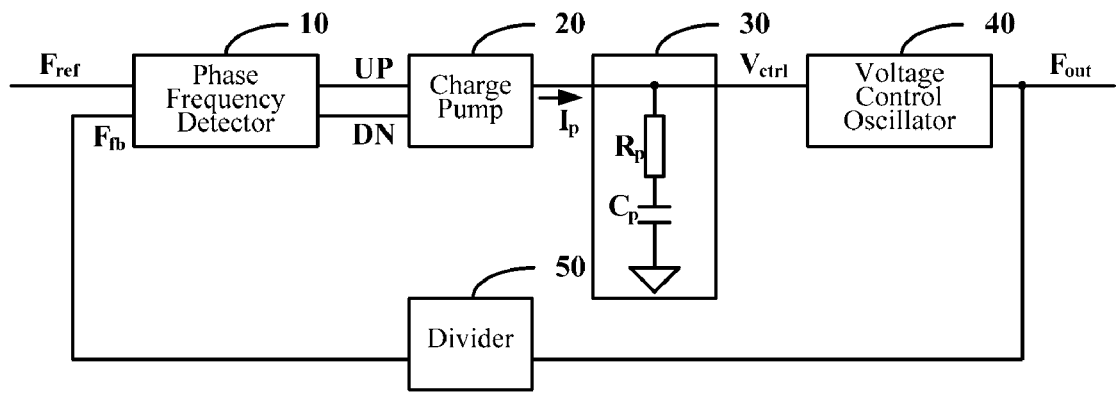
FIG. 1 is a schematic diagram of a structure of a basic PLL.
Figure 2:
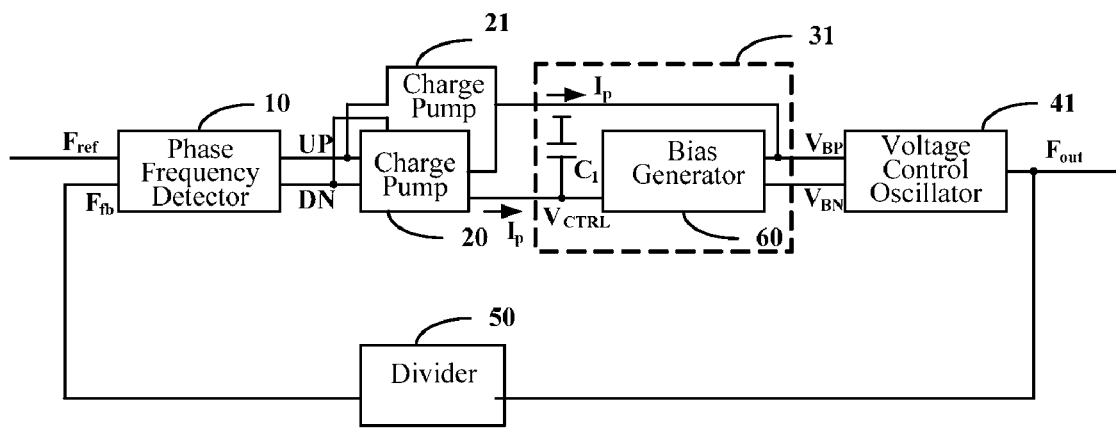
FIG. 2 is a schematic diagram of a basic structure of a self-biased PLL.
Figure 3:
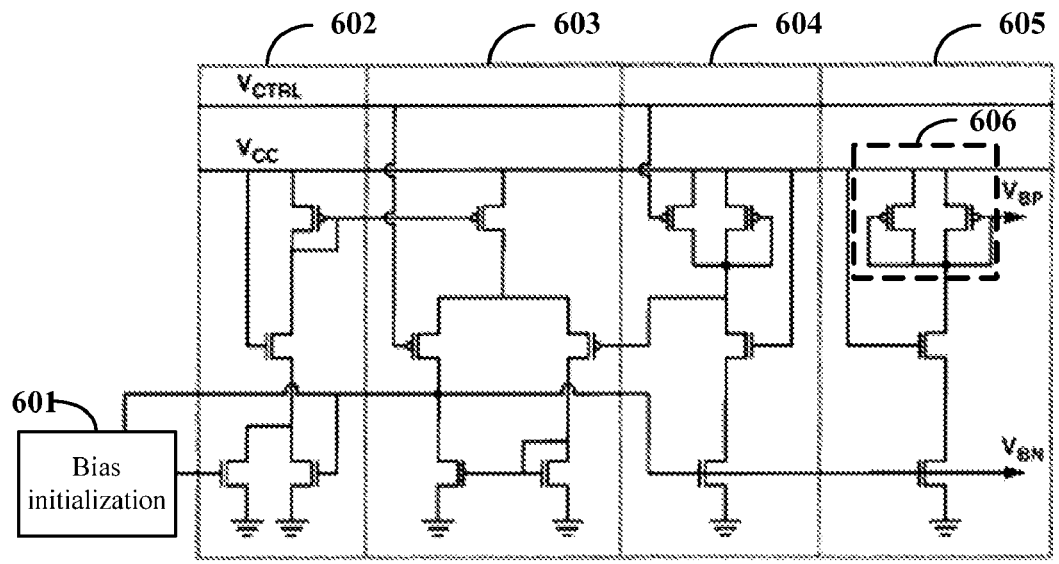
FIG. 3 is a circuit diagram of a bias generator of the self-biased PLL illustrated in FIG. 2.
Figure 4:
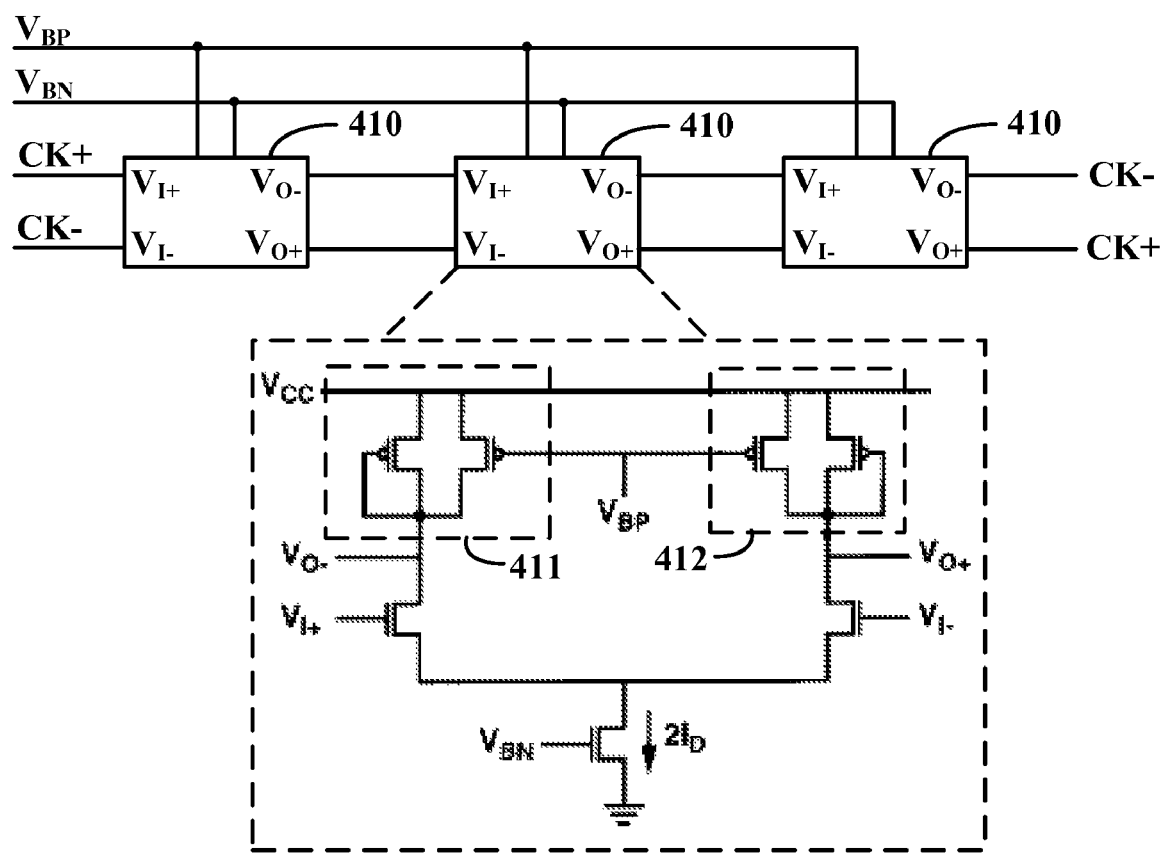
FIG. 4 is a circuit diagram of a VCO of the self-biased PLL illustrated in FIG. 2.
Figure 5:
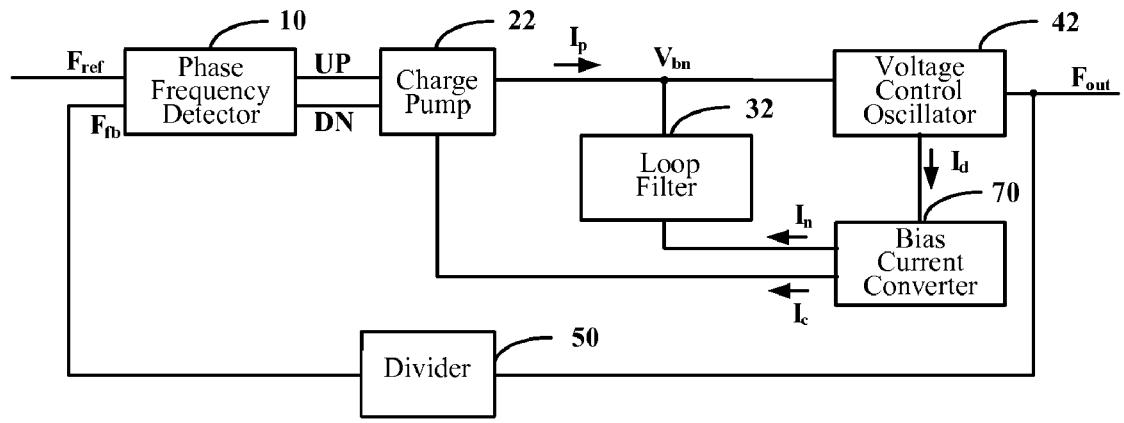
FIG. 5 is a schematic diagram of a basic structure of a self-biased PLL according to an embodiment of the present invention.

The embodiments of the present invention will be described in detail below with reference to the drawings. FIG. 5 is a schematic diagram of a basic structure of a self-biased PLL according to an embodiment of the present invention, and the self-biased PLL includes a PFD 10, a CP 22, an LF 32, a VCO 42, a bias current converter 70 and a divider 50.

The PFD 10 detects a frequency difference and a phase difference between an input signal $F_{ref}$ and a feedback signal $F_{fb}$ and generates pulse control signals UP and DN. For example, when a phase of the feedback signal $F_{fb}$ lags behind that of the input signal $F_{ref}$, a pulse width of the pulse control signal UP is larger than that of the pulse control signal DN. When the phase of the feedback signal $F_{fb}$ leads over that of the input signal $F_{ref}$, the pulse width of the pulse control signal UP is smaller than that of the pulse control signal DN. The circuit structure of the PFD 10 is well known to those skilled in the art and will not be further described here.

The CP 22 generates a charging or discharging current $I_P$ according to the pulse control signals UP and DN output from the PFD 10. When the phase of the feedback signal $F_{fb}$ lags behind that of the input signal $F_{ref}$, the pulse width of the pulse control signal UP is larger than that of the pulse control signal DN and the CP 22 outputs the charging current $I_P$, When the phase of the feedback signal $F_{fb}$ leads over that of the input signal $F_{ref}$, the pulse width of the pulse control signal UP is smaller than that of the pulse control signal DN and the CP 22 outputs the discharging current $I_P$. The charging current or discharging current $I_P$ equals to a first control current $I_c$ input to the CP 22.

Figure 6:
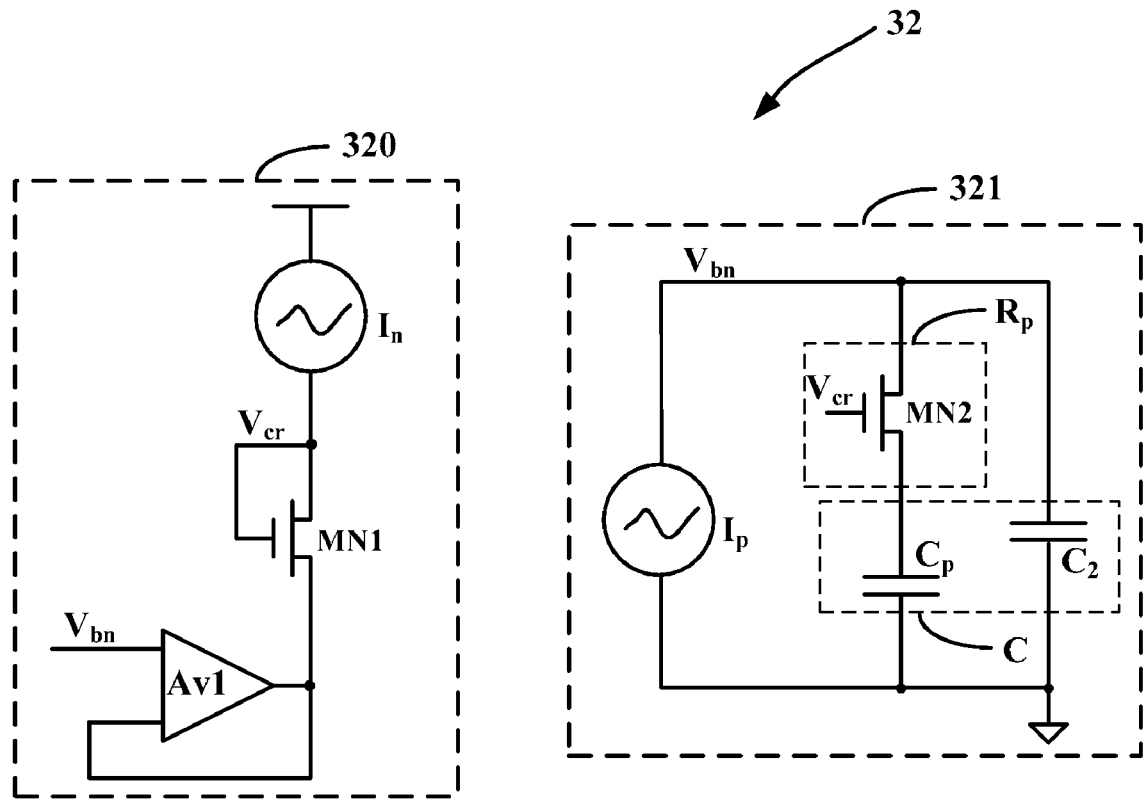
FIG. 6 is a circuit diagram of an embodiment of an LF of the self-biased PLL illustrated in FIG. 5.

The LF 32 is connected with the CP 22 and outputs a first control voltage $V_{bn}$. When the CP 22 outputs the charging current $I_P$, the first control voltage $V_{bn}$ is increased and when the CP 22 outputs the discharging current $I_P$, the first control voltage $V_{bn}$ is decreased. Where, the resistance of the LF 32 is controlled by the first control voltage $V_{bn}$ and the second control voltage, the second control voltage is adjusted according to the first control voltage $V_{bn}$ and a second control current $I_n$ which is input to the LF 32. A specific circuit structure of the LF 32 as illustrated in FIG. 6 will be described in detail later.

Figure 7:
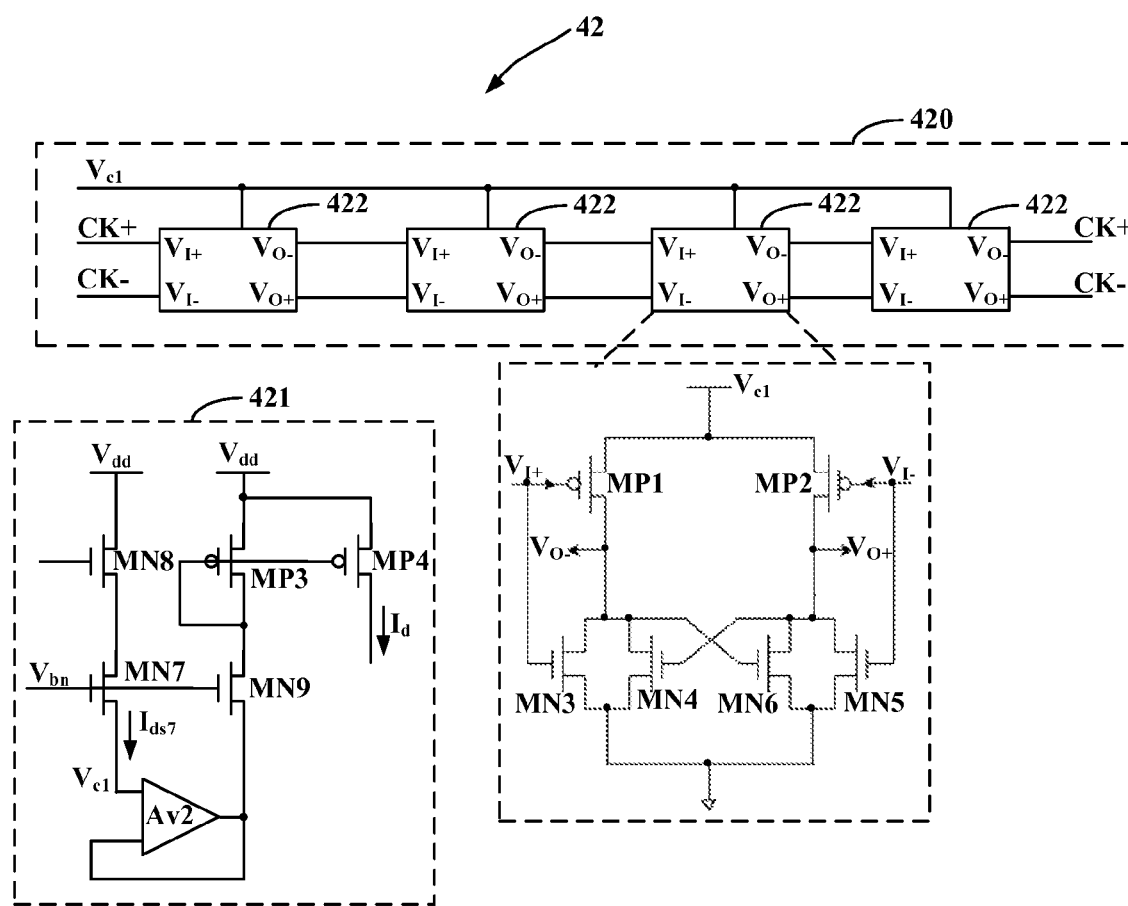
FIG. 7 is a circuit diagram of an embodiment of a VCO of the self-biased PLL illustrated in FIG. 5.

The VCO 42 generates the oscillation voltage and the bias current $I_d$ according to the first control voltage $V_{bn}$, and increases an oscillation frequency of an output signal $F_{out}$ when the oscillation voltage is increased and decreases the oscillation frequency of the output signal $F_{out}$ when the oscillation voltage $V_{bn}$ is decreased. A specific circuit structure of the VCO 42 as illustrated in FIG. 7 will be described in detail later.

The output signal $F_{out}$ of the VCO 42 generates a feedback signal $F_{fb}$ through the divider 50, that is, $F_{fb}=F_{out}/N$, where N denotes a frequency division factor of the divider 50. The entire system forms a feedback system, and the frequency and phase of the output signal $F_{out}$ are locked to a fixed frequency and phase.

The bias current converter 70 converts the bias current $I_d$ generated by the VCO 42 into the first control current $I_c$ provided to the CP 22 and the second control current $I_n$ provided to the LF 32. The first control current $I_c$ equals to the ratio of the bias current $I_d$ to a constant x, and the second control current $I_n$ equals to the ratio of the bias current $I_d$ to the frequency division factor N of the divider, that is:

$$I_c = \frac{I_d}{x} = I_p \quad (5)$$

$$I_n = \frac{I_d}{N} \quad (6)$$

Equations (5) and (6) indicate that the first control current $I_c$ and the second control current $I_n$ are proportional to the bias current $I_d$ output from the VCO 42, which can be implemented by a current mirror with an output current and an input current in a multiple relationship. A specific circuit structure of the current mirror is well known to those skilled in the art and therefore will not be further described here. The bias current converter 70 includes a first current mirror and a second current mirror (not shown). The first current mirror to which the bias current $I_d$ is input outputs the first control current $I_c$ which is 1/x times than the input current, and the second current mirror to which the bias current $I_d$ is input outputs the second control current $I_n$ which is 1/N times than the input current.

FIG. 6 is a specific circuit for implementing the LF 32 illustrated in FIG. 5. As shown in FIG. 6, the LF 32 includes a filter bias unit 320 and a filter unit 321. The filter bias unit 320 adjusts a second control voltage $V_{cr}$ according to a first control voltage $V_{bn}$ and a second control current $I_n$ which is input to the LF 32. The filter unit 321 increases the first control voltage when the CP outputs the charging current and decreases the first control voltage when the CP outputs the discharging current.

The filter bias unit 320 includes a first voltage follower Av1, a first NMOS transistor MN1 and a first current source $I_n$. The first voltage follower Av1 is an operation amplifier. One input terminal of the operation amplifier Av1 is the first control voltage $V_{bn}$, and the other input terminal of the operation amplifier Av1 is connected with an output terminal thereof, that is, an output voltage of the operation amplifier Av1 equals to (or follows) the first control voltage $V_{bn}$, and the first voltage follower Av1 functions to drive the first NMOS transistor MN1. A source of the first NMOS transistor MN1 is connected with the output terminal of the first voltage follower Av1. A gate and a drain of the first NMOS transistor MN1 are connected with each other and are connected to the first current source $I_n$. A current of the first current source $I_n$ is provided by the second control current $I_n$ output from the bias current converter 70. The drain and source currents of the first NMOS transistor MN1 is provided by the first current source. Therefore, it can be concluded in combination with Equation 6 that drain and source currents of the first NMOS transistor MN1 will satisfy $I_{ds1}=I_n=I_d/N$.

The source voltage of the first NMOS transistor MN1 is the first control voltage $V_{bn}$ and the gate voltage thereof is the second control voltage $V_{cr}$, and the first NMOS transistor MN1 operates in a saturation region. Therefore, the drain and source currents $I_{ds1}$ of the first NMOS transistor MN1 can be expressed in Equation (7):

$$I_{ds1} = I_n = \frac{I_d}{N} = \frac{1}{2}*k1*(V_{gs1}-Vt)^2 \quad (7)$$

where k1 denotes a process factor of the first NMOS transistor MN1 (the process factor relates to the carrier mobility and ratio of channel width to length of the MOS transistor), Vt denotes a threshold voltage of the first NMOS transistor, and $V_{gs1}=V_{bn}-V_{cr}$ is a gate-source voltage of the first NMOS transistor MN1. Therefore, the second control voltage $V_{cr}$ can be adjusted with the change of the first control voltage $V_{bn}$ and the second control current $I_n$.

The filter unit 321 includes a resistor $R_p$, a capacitor C and a second current source $I_p$. The resistor $R_p$ are controlled by the first control voltage $V_{bn}$ and the second control voltage $V_{cr}$. The resistor $R_p$ and the capacitor C are charged when the CP22 outputs the charging current $I_p$, thus the first control voltage $V_{bn}$ is increased. The resistor $R_p$ and the capacitor C are discharged when the CP22 outputs the discharging current $I_p$, thus the first control voltage $V_{bn}$ is decreased. The resistance of the resistor $R_p$ in the filter unit 321 equals to the resistance of the loop filter 32.

The resistor $R_p$ of the filter unit 321 includes the second NMOS transistor MN2 and the capacitor C of the filter unit 321 includes the first capacitor $C_p$ and the second capacitor $C_2$. The source of the second NMOS transistor MN2 is connected with one terminal of the first capacitor $C_p$, the drain is connected with one terminal of the second capacitor $C_2$, and the gate is connected with the gate and drain of the first NMOS transistor MN1. Other terminals of the first capacitor $C_p$ and the second capacitor $C_2$ are connected with a first voltage (typically the earth); and the second current source $I_p$ is connected in parallel with the resistor $R_p$ and the first capacitor $C_p$ which are connected in series, that is, connected with the two terminals of the second capacitor $C_2$ to provide the resistor $R_p$ and the capacitor C with the charging and discharging current. The current of the second current source $I_p$ is provided by the charging or discharging current $I_p$ output from the CP 22 (that is, the first control current $I_c$ output from the bias current converter 70).

The drain voltage of the second NMOS transistor MN2 is the first control voltage $V_{bn}$ and the gate voltage is the second voltage $V_{cr}$. After the PLL is locked, there is no voltage drop at two terminals of the resistor $R_p$, that is, $V_{ds2}$=0, and the second NMOS transistor MN2 operates in a linear region. Therefore, drain-source currents $I_{ds2}$ of the second NMOS transistor MP2 can be expressed in Equation (8):

$$I_{ds2} = \frac{1}{2} * k2 * [2(V_{gs2} - Vt) * V_{ds2} - V_{ds2}^2] \quad (8)$$

where k2 denotes a process factor of the second NMOS transistor and is assumed that k2=k1 (in order to simplify the derivation, all process factors of the NMOS transistor are assumed to be the same, actually, a constant ratio relation exists among different process factors of the NMOS transistor), Vt denotes a threshold voltage of the NMOS transistor, and $V_{gs2}=V_{bn}-V_{cr}$ is the gate-source voltage of the second NMOS transistor MN2. The resistor $R_p$ includes a NMOS transistor. The MOS transistor is a voltage-controlled device and the transconductance of the MOS transistor is controlled by the gate, source and drain voltages. The transconductance grds2 of the second NMOS transistor MN2 can be derived from Equation (8) and expressed in Equation (9):

$$grds2 = \frac{\partial I_{ds2}}{\partial V_{ds2}} = k2 * \left[ (V_{gs2} - Vt) - \frac{1}{2} V_{ds2} \right] \quad (9)$$

Both sides of Equation (7) are multiplied by k1 and transformed to derive:

$$k1 * (V_{gs1} - Vt) = \sqrt{\frac{2 * k1 * I_d}{N}} \quad (7\text{-}1)$$

Equation (7-1), $V_{ds2}$=0, $V_{gs2}=V_{bn}-V_{cr}=V_{gs1}$, k2=k1 are substituted into Equation (9) to derive:

$$grds2 = k1 * (V_{gs2} - Vt) = \sqrt{\frac{2 * k1 * I_d}{N}} \quad (9\text{-}1)$$

Therefore, the resistor $R_p$ of the filter unit 321 can be expressed in Equation (10):

$$R_p = 1 / grds2 = \sqrt{\frac{N}{2 * k1 * I_d}} \quad (10)$$

FIG. 7 is a specific circuit for implementing the VCO 42 illustrated in FIG. 5. As shown in FIG. 7, the VCO 42 includes an oscillation unit 420 and an oscillation voltage and bias current generating unit 421. In this embodiment, the oscillation unit 420 is the differential ring oscillator including n (n≧2) differential buffer delay stages 422 connected in series. The ring oscillator illustrated in FIG. 7 includes four differential buffer delay stages 422. Where, a positive input terminal $V_{I+}$ of a subsequent differential buffer delay stage 422 is connected with a negative output terminal $V_{O-}$ of a previous differential buffer delay stage 422, and a negative input terminal $V_{I-}$ of the subsequent differential buffer delay stage 422 is connected with a positive output terminal $V_{O+}$ of the previous differential buffer delay stage 422; and a positive input terminal $V_{I+}$ of the first differential buffer delay stage 422 is connected with a positive output terminal $V_{O+}$ of the last differential buffer delay stage 422, and a negative input terminal $V_{I-}$ of first differential buffer delay stage 422 is connected with a negative output terminal $V_{O-}$ of the last differential buffer delay stage 422.

An oscillation frequency of the oscillation unit 420, that is, the frequency of an output signal $F_{out}$, is increased when an input oscillation voltage $V_{c1}$ is increased, and the oscillation frequency of the oscillation unit 420 is decreased when the oscillation voltage $V_{c1}$ is lowered. In other words, the frequency of the signal CK+ or CK− output from the last differential buffer delay stage is controlled by the oscillation voltage $V_{c1}$. When the oscillation voltage $V_{c1}$ is increased, the frequency of the signal CK+ or CK− is increased, and when the oscillation voltage $V_{c1}$ is decreased, the frequency of the signal CK+ or CK− is decreased.

The differential buffer delay stage 422 includes a third NMOS transistor MN3 a fourth NMOS transistor MN4, a first PMOS transistor MP1, a fifth NMOS transistor MN5, a sixth NMOS transistor MN6 and a second PMOS transistor MP2. The source of the third NMOS transistor MN3 and the source of the fourth NMOS transistor MN4 are connected with each other and are connected with a first voltage (typically, the earth). The drain of the third NMOS transistor MN3 is connected with the drain of the fourth NMOS transistor MN4 and is connected with the drain of the first PMOS transistor MP1. The gate of the third NMOS transistor MN3 and the gate of the first PMOS transistor MP1 are connected with each other. Since circuits at the left and right sides of the differential buffer delay stage 422 are completely symmetric, the fifth NMOS transistor MN5, the sixth NMOS transistor MN6 and the second PMOS transistor MP2 are connected in the same way as the third NMOS transistor MN3, the fourth NMOS transistor MN4 and the first PMOS transistor MP1. In addition, the gate of the fourth NMOS transistor MN4 is connected with the drain of the fifth NMOS transistor MN5 and the drain of the six NMOS transistor MN6. The gate of the sixth NMOS transistor MN6 is connected with the drain of the third NMOS transistor MN3 and the drain of the fourth NMOS transistor MN4. The source of the first PMOS transistor MP1 is connected with the source of the second PMOS transistor MP2.

The gate of the third NMOS transistor MN3 and the gate of the first PMOS transistor MP1 are the positive input terminal $V_{I+}$. The drain of the third NMOS transistor MN3, the drain of the fourth NMOS transistor MN4, the drain of the first PMOS transistor MP1 and the gate of the sixth NMOS transistor MN6 are the negative output $V_{O-}$. The gate of the fifth NMOS transistor MN5 and the gate of the second PMOS transistor MP2 are negative input terminal $V_{I-}$. The drain of the fifth NMOS transistor MN5, the drain of the sixth NMOS transistor MN6, the drain of the second PMOS transistor MP2 and the gate of the fourth NMOS transistor MN4 are the positive output $V_{O+}$. The source voltages of the first PMOS transistor MP1 and the second PMOS transistor MP2 are the oscillation voltage $V_{c1}$. The time delay of the differential buffer delay stage 422 and the frequency of the output signal $F_{out}$ of the VCO 42 (CK+ or CK1) vary with the oscillation voltage $V_{c1}$.

The differential buffer delay stage 422 of the oscillation unit 420 according to the embodiment of the present invention may be implemented with an existing differential structure in stead of the differential connection structure with symmetric load. Moreover, no NMOS transistor is added between the differential buffer delay stages to ensure that the oscillation unit 420 is able to oscillate.

The oscillation voltage and bias current generating unit 421 generates a bias current $I_d$ and an oscillation voltage $V_{c1}$ which is provided to the differential buffer delay stage 422 of the oscillation unit 420 according to the first control voltage $V_{bn}$. The oscillation voltage and bias current generating unit 421 includes a seventh NMOS transistor MN7, an eighth NMOS transistor MN8, a ninth NMOS transistor MN9, a second voltage follower Av2, a third PMOS transistor MP3 and a fourth PMOS transistor MP4.

The oscillation voltage $V_{c1}$ of the differential buffer delay stages 422 is generated by the seventh NMOS transistor MN7 and the eighth NMOS transistor MN8 based on the first control voltage $V_{bn}$. The gate voltage of the seventh NMOS transistor MN7 is the first control voltage $V_{bn}$ and the source voltage is the oscillation voltage $V_{c1}$. The drain of the eighth NMOS transistor MN8 is provided with the second voltage $V_{dd}$ (typically, from an analog voltage source of 3.3V) and the gate is connected with an RC filter circuit (not shown). The drain of the seventh NMOS transistor MN7 and the source of the eighth NMOS transistor MN8 are connected. The above connection has an effect of power supply ripple rejection. In other words, the noise of the second voltage $V_{dd}$ (the analog voltage source) has little effect on the oscillation voltage $V_{c1}$. The noise of the oscillation voltage $V_{c1}$ is small, thus, the frequency of the output signal $F_{out}$ (CK+ or CK-) of the VCO 42 is more stable and has a low jitter. Thus, the phase noise of the PLL is also small.

The bias current $I_d$ is generated by the seventh NMOS transistor MN7, the ninth NMOS transistor MN9, the second voltage follower Av2, the third PMOS transistor MP3 and the fourth PMOS transistor MP4 based on the first control voltage $V_{bn}$. The gate of the ninth NMOS transistor MN9 is connected with the gate of the seventh NMOS transistor MN7 and the source is connected with the output terminal of the second voltage follower Av2. The second voltage follower Av2 is an operation amplifier. One input terminal of the operation amplifier Av2 is the oscillation voltage $V_{c1}$ and the other input terminal of the operation amplifier Av2 is connected with an output terminal thereof, that is, an output voltage of the operation amplifier Av2 equals to (or follows) the oscillation voltage $V_{c1}$, and the second voltage follower Av2 functions to drive the ninth NMOS transistor MN9. The drain of the third PMOS transistor MP3 is connected with the drain of the ninth NMOS transistor MN9. The third PMOS transistor MP3 and the fourth PMOS transistor MP4 construct a current mirror: the source of the third PMOS transistor MP3 and the source of the fourth PMOS transistor MP4 are provided with the second voltage $V_{dd}$, the gate and drain of the third PMOS transistor MP3 are connected with the gate of the fourth PMOS transistor MP4. The output current from the drain of the fourth PMOS transistor MP4 is the bias current $I_d$. The bias current $I_d$ is proportion to the current passing through the third PMOS transistor MP3 (that is, the drain-source current of the third PMOS transistor MP3), and the ratio of the current passing through the third PMOS transistor MP3 to the bias current $I_d$ is equal to a value obtained by dividing the ratio of channel width to length of the fourth PMOS transistor MP4 with the ratio of channel width to length of the third PMOS transistor MP3.

If it is assumed that the ratio of channel width to length of the fourth PMOS transistor MP4 equals to the ratio of channel width to length of the third PMOS transistor MP3, the bias current $I_d$ equals to the current passing through the third PMOS transistor MP3. Because the drain of the third PMOS transistor MP3 is connected with the drain of the ninth NMOS transistor MN9, the current flowing through the third PMOS transistor MP3 equals to the drain-source current $I_{ds9}$ of the ninth NMOS transistor MN9. The gate voltage of the ninth NMOS transistor MN9 equals to the gate voltage of the seventh NMOS transistor MN7 (both are the first control voltage $V_{bn}$). The source voltage of the ninth NMOS transistor MN9 equals to the source voltage of the seventh NMOS transistor MN7 (both are the oscillation voltage $V_{c1}$). Therefore, the drain-source current $I_{ds9}$ of the ninth NMOS transistor MN9 equals to the drain-source current $I_{ds7}$ of the seventh NMOS transistor MN7. Thus, it can be included that the bias current $I_d$ equals to the drain-source current $I_{ds7}$ of the seventh NMOS transistor MN7.

The seventh NMOS transistor MN7 operates in a saturation region. Therefore, the drain-source current $I_{ds7}$, that is, the bias current $I_d$ output from the oscillation voltage and bias current generating unit 421, can be expressed with Equation (11):

$$I_d = I_{ds7} = \frac{1}{2} * k7 * (V_{gs7} - Vt)^2 \qquad (11)$$

where k7 denotes a process factor of the seventh NMOS transistor MN7 (similarly, in order to simplify the derivation, it is assumed that k7=k1, actually, a constant ratio relation exists between the process factor of the first NMOS transistor MN1 and the process factor of the seventh NMOS transistor MN7), Vt denotes a threshold voltage of the NMOS transistor, and $V_{gs7}$ denotes the gate-source voltage of the seventh NMOS transistor MN7.

The oscillation frequency of the VCO 42 (the oscillation frequency of the oscillation unit) $\omega_V$ can be expressed with Equation (12):

$$\omega_V = \frac{g_m}{C_b} = \frac{\sqrt{2k0 * I_{ds7}}}{C_b} = \frac{\sqrt{2k0 * \frac{1}{2} * k7 * (V_{gs7} - Vt)^2}}{C_b} = \frac{k1 * (V_{gs7} - Vt)}{C_b} \qquad (12)$$

where gm denotes the transconductance of the oscillation unit 420, k0 denotes a process factor of the MOS transistor in VCO 420 (similarly, in order to simplify the derivation, it is assumed that k0=k1), $C_b$ denotes a parasitic capacitance of the VCO. A gain $K_V$ of the VCO 42 can be derived from Equation (12) by substituting the drain-source current $I_{ds7}$ with Equation (11):

$$K_v = \frac{\partial F_V}{\partial V_{gs7}} = \frac{\partial(\omega_V/2\pi)}{\partial V_{gs7}} = \frac{k1}{2\pi * C_b} \quad (13)$$

Equations (5), (10) and (13) are substituted into Equation (1) to derive the loop damping factor ξ:

$$\xi = \frac{R_p}{2}\sqrt{\frac{I_p K_v C_p}{N}} = \quad (14)$$

$$\frac{1}{2}\sqrt{\frac{N}{2*k1*I_d}*\frac{I_d}{x}*\frac{k1}{2\pi*C_b}*\frac{C_p}{N}} = \frac{1}{4}\sqrt{\frac{C_p}{\pi*x*C_b}}$$

As can be seen from Equation (14), the loop damping factor ξ only depends on the parameters x, $C_b$, $C_p$. Because the capacitors $C_b$ and $C_p$ are determined during the fabrication process, the loop damping factor can be kept as a fixed value by setting the values of the parameters x and y appropriately. The value of x is determined according to the required loop damping factor ξ. For example, the required loop damping factor ξ=1 and the capacitor $C_p$=112.5 pF, thus it is derived that the $C_b$=0.112 pF through a simulation test, moreover, it can be obtained that x=20. In other words, the charging or discharging current $I_p$ output from the CP 22 is one twentieth of the bias current $I_d$ output from the VCO 42.

Equations (5) and (13) are substituted into Equation (2) to derive the loop bandwidth $\omega_n$:

$$\omega_n = \sqrt{\frac{K_v I_p}{NC_p}} = \sqrt{\frac{k1}{2\pi*C_b}*\frac{I_d}{x}*\frac{1}{N*C_p}} = \quad (15)$$

$$\sqrt{\frac{2k1*I_d}{C_b^2}*\frac{C_b}{4\pi*x*N*C_p}} = \frac{\sqrt{2k1*I_d}}{C_b}*\sqrt{\frac{C_b}{4\pi*x*N*C_p}}$$

With reference to Equation (12), $$\omega_V = \frac{\sqrt{2k0*I_{ds7}}}{C_b},$$

k0=k1, $I_{ds7}=I_d$ and $\omega_V=\omega_{ref}*N$ are substituted into Equation (15) to derive:

$$\omega_n = \frac{\sqrt{2k1*I_d}}{C_b}*\sqrt{\frac{C_b}{4\pi*x*N*C_p}} = \omega_V*\sqrt{\frac{C_b}{4\pi*x*N*C_p}} = \quad (15-1)$$

$$\omega_{ref}*N*\sqrt{\frac{C_b}{4\pi*x*N*C_p}} = \omega_{ref}*\sqrt{\frac{N*C_b}{4\pi*x*C_p}}$$

Therefore, the ratio of the loop bandwidth $\omega_n$ to the input frequency $\omega_{ref}$ is:

$$\frac{\omega_n}{\omega_{ref}} = \sqrt{\frac{N*C_b}{4\pi*x*C_p}} \quad (16)$$

As can be seen from Equation (16), after the capacitors $C_b$ and $C_p$ are determined during the fabrication process and the value of the parameter x is set, the loop bandwidth $\omega_n$ of the PLL can follow the input frequency $\omega_{ref}$ of the PLL, and the ratio of the loop bandwidth $\omega_n$ to the input frequency $\omega_{ref}$ is proportional to a square root of the frequency division factor N of the divider 50 (that is, $\sqrt{N}$). For example, the above capacitors $C_p$=112.5 pF, $C_b$=0.112 pF and x=20 are substituted into Equation (16) to derive:

| N | $F_{ref}$(MHz) | $F_n$ (KHz) | $\omega_n/\omega_{ref}$(%) |
|---|---|---|---|
| 8 | 125 | 707 | 0.56 |
| 64 | 23 | 364.8 | 1.58 |
|  | 7.8 | 123.6 |  |
| 128 | 11.7 | 261.4 | 2.23 |
|  | 3.9 | 87.1 |  |
| 254 | 5.9 | 186 | 3.15 |
|  | 2 | 63 |  |

As apparent from the above table, a relatively narrow loop bandwidth $\omega_n=2\pi F_n$ can be obtained even if an input frequency $\omega_{ref}=2\pi F_{ref}$ or frequency division factor N is larger, thereby resulting in a relatively low jitter of the self-biased PLL and hence good performance thereof.

In summary, the technical solution according to one embodiment of the present invention has the following advantages.

In the VCO, the oscillation voltage is generated by the first control voltage to control the oscillation frequency of the oscillation unit of the VCO. The bias current is generated by the first control voltage and bias current generated by the VCO is converted into the first control current input to the CP and the second control current input to the LF through the bias current converter. Where, the first control current is adapted to control the charging and discharging of the resistor and capacitor of the LF so as to change the first control voltage and the second control current is adapted to adjust the second control voltage together with the first control voltage so as to control the resistor of the LF. Therefore, the above technical solutions require only one CP to satisfy the requirement that the loop damping factor needs to be kept as a fixed value, thereby simplifying the circuit structure of the self-biased PLL as compared with the existing self-bias PLL which requires two CPs.

Because the oscillation unit of the VCO may directly employ the existing differential ring oscillator and the differential connection with symmetric load of the existing self-biased PLL is not used in the differential buffer delay stage of the oscillation unit, the modification to the basic PLL is very small and the self-biased PLL according to the present invention is easy to be implemented.

Compared with the existing self-biased PLL in which the NMOS transistor is added between the differential buffer delay stages with symmetric load, because no NMOS transistor is added between the differential buffer delay stages to ensure that the oscillation unit is able to oscillate, the frequency of the output signal of the VCO will not be affected and the circuit structure is simplified.

Because the complex bias generator circuit of the prior art is omitted, the circuit structure of the self-biased PLL is further simplified. Moreover, because the circuit structures of the LF, VCO and the bias current generator are simple, the self-biased PLL according to the present invention is easy to be implemented.

The circuit of VCO may restrain the power supply noise. In other words, the power supply noise has a small affection on the oscillation voltage. Because the noise of the oscillation voltage is small, the frequency of the output signal of the VCO is stable and has a low jitter. Thus, the phase noise of the PLL is also small.

The loop bandwidth of the PLL is optimized. The loop bandwidth will not be too narrow when the input frequency is low and the loop bandwidth will not be too wide when the input frequency is high. Thus, the low frequency noise at the input terminal and the high frequency noise from the VCO can be restrained as far as possible.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed is:

1. A self-biased Phase Locked Loop, PLL, comprising:
   a Phase Frequency Detector, PFD, adapted to detect a frequency difference and a phrase difference between an input signal and a feedback signal and to generate a pulse control signal;
   a Charge Pump, CP, adapted to generate a charging or discharging current which equals to a first control current input to the CP according to the pulse control signal output from the PFD;
   a Loop Filter, LF, adapted to output a first control voltage so as to raise the first control voltage when the CP outputs the charging current and lower the first control voltage when the CP outputs the discharging current, the resistance of the LF is controlled by the first control voltage and a second control voltage which is adjusted according to the first control voltage and a second control current input to the LF;
   a Voltage Control Oscillator, VCO, adapted to generate an oscillation voltage and a bias current according to the first control voltage output from the LF so as to increase an oscillation frequency of an output signal when the oscillation voltage is increased and decrease the oscillation frequency of the output signal when the oscillation voltage is lowered;
   a divider adapted to perform a frequency division on the output signal of the VCO and generate the feedback signal input to the PFD; and
   a bias current converter adapted to convert the bias current generated by the VCO into the first control current input to the CP and the second control current input to the LF, wherein the first control current equals to the ratio of the bias current to a constant, and the second control current equals to the ratio of the bias current to a frequency division factor of the divider;
   wherein the LF further comprises:
   a filter unit adapted to increase the first control voltage when the CP outputs the charging current and lowers the first control voltage when the CP outputs the discharging current; and
   a filter bias unit adapted to the adjust the second control voltage according to the first control voltage and the second control current input to the LF.

2. The self-biased PLL according to claim 1, wherein:
   the filter bias unit comprises a first voltage follower, a first NMOS transistor and a first current source, wherein, the first control voltage is input to one input terminal of the first voltage follower and the other input terminal of the first voltage follower is connected with an output terminal of the first voltage follower and a source of the first NMOS transistor; a gate and a drain of the first NMOS transistor are provided with the second control voltage; a drain-source current of the first NMOS transistor is provided by the first current source, the current provided by the first current source is the second control current output from the bias current converter; and
   the filter unit further comprises a resistor, a capacitor and a second current source; the resistor of the filter unit constructs the resistance of the LF and comprises the second NMOS transistor, and the capacitor comprises a first capacitor and a second capacitor; wherein, one terminal of the first capacitor is connected with a source of the second NMOS transistor, one terminal of the second capacitor is connected with a drain of the second NMOS and the other terminal is connected with the other terminal of the first capacitor and is provided with the first voltage; a drain voltage of the second NMOS transistor is the first control voltage and a gate voltage is the second control voltage; the second current source is connected with the second capacitor and the current of the second current source is the charging or discharging current output from the CP.

3. The self-biased PLL according to claim 1, wherein, the VCO comprises:
   an oscillation unit adapted to increase the oscillation frequency of the output signal when the oscillation voltage is increased and decrease the oscillation frequency of the output signal when the oscillation voltage is lowered; and
   an oscillation voltage and bias current generating unit, adapted to generate the bias current and the oscillation voltage provided to the oscillation unit according to the first control voltage.

4. The self-biased PLL according to claim 3, wherein, the oscillation unit comprises at least two differential buffer delay stages connected in series; wherein, a positive input terminal of a back differential buffer delay stage is connected with a negative output terminal of a front differential buffer delay stage and a negative input terminal of the back differential buffer delay stage is connected with a positive output terminal of the front differential buffer delay stage; a positive input terminal of a first differential buffer delay stage is connected with a positive output terminal of a last differential buffer delay stage and a negative input terminal of the first differential buffer delay stage is connected with a negative output terminal of the last differential buffer delay stage; and the oscillation frequency of the differential buffer delay stages is controlled by the oscillation voltage.

5. The self-biased PLL according to claim 4, wherein:
   the differential buffer delay stage comprises a third NMOS transistor, a fourth NMOS transistor, a first PMOS transistor, a fifth NMOS transistor, a sixth NMOS transistor and a second PMOS transistor; wherein, a gate of the third NMOS transistor and a gate of the first PMOS transistor are positive input terminals; a drain of the third NMOS transistor, a drain of the fourth NMOS transistor, a drain of the first PMOS transistor and a gate of the sixth NMOS transistor are negative output terminals; a gate of the fifth NMOS transistor and a gate of the second PMOS transistor are negative input terminals; a drain of the fifth NMOS transistor, a drain of the sixth NMOS transistor, a drain of the second PMOS transistor and a gate of the fourth NMOS transistor are positive output terminals; the oscillation voltage is provided to sources of the first PMOS transistor and the second PMOS transistor and the first voltage is provided to sources of the third NMOS transistor, the fourth NMOS transistor, the fifth NMOS transistor and the sixth NMOS transistor; and the oscillation voltage and bias current unit comprises a seventh NMOS transistor, an eighth NMOS transistor, a ninth NMOS transistor, a second voltage follower, a third PMOS transistor and a fourth PMOS transistor; wherein, a gate voltage of the seventh NMOS transistor is the first control voltage and a source voltage of the seventh NMOS transistor is the oscillation voltage; a drain of the eighth NMOS transistor is provided with the second voltage and a gate of the eighth NMOS transistor is connected with an RC filter circuit; a drain of the seventh NMOS transistor is connected with a source of the eighth NMOS transistor; a gate of the ninth NMOS transistor is connected with a gate of the seventh NMOS transistor and a source of the ninth NMOS transistor is connected with an output terminal of the second voltage follower; one input terminal of the second voltage follower is provided with the oscillation voltage and the other input terminal is connected with the output terminal of the second voltage follower; a drain of the third PMOS transistor is connected with a drain of the ninth NMOS transistor; the third PMOS transistor and the fourth PMOS transistor construct a current mirror; and a current output from a drain of the fourth PMOS transistor is the bias current.

6. The self-biased PLL according to claim 1, wherein, the bias current converter comprises:
 a first current mirror adapted to be provided with the bias current and output the first control current which is 1/x times than the input current, where x is a constant; and
 a second current mirror adapted to be provided with the bias current and output the second control current which is 1/N times than the input current, where N is the frequency division factor of the divider.

* * * * *